United States Patent
Cheng et al.

(10) Patent No.: US 7,804,671 B2
(45) Date of Patent: Sep. 28, 2010

(54) ELECTROSTATIC DISCHARGE PROTECTION CIRCUIT

(75) Inventors: Bob Cheng, Taipei Hsien (TW); Tony Ho, Taipei Hsien (TW); Bouryi Sze, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 431 days.

(21) Appl. No.: 11/937,487

(22) Filed: Nov. 8, 2007

(65) Prior Publication Data

US 2008/0062607 A1 Mar. 13, 2008

Related U.S. Application Data

(63) Continuation-in-part of application No. 10/904,080, filed on Oct. 22, 2004, now abandoned.

(30) Foreign Application Priority Data

Apr. 29, 2004 (TW) ............................... 93112069 A

(51) Int. Cl.
*H02H 1/00* (2006.01)
*H02H 9/00* (2006.01)
*H01L 23/62* (2006.01)

(52) U.S. Cl. .................. 361/56; 361/91.3; 361/111; 361/113; 257/173; 257/174; 257/175; 257/355; 257/546; 257/E21.703; 257/E27.046; 257/E27.051

(58) Field of Classification Search .............. 361/56, 361/91.3, 111, 113; 257/173, 174, 175, 355, 257/546, E21.703, E27.046, E27.051
See application file for complete search history.

(56) References Cited

U.S. PATENT DOCUMENTS

| | | | |
|---|---|---|---|
| 6,885,534 B2 * | 4/2005 | Ker et al. | 361/113 |
| 7,012,678 B2 * | 3/2006 | Enomoto et al. | 356/237.1 |
| 7,023,678 B2 | 4/2006 | Ker et al. | |
| 7,557,590 B2 * | 7/2009 | Yakabe | 324/686 |
| 2002/0130390 A1 * | 9/2002 | Ker et al. | 257/546 |
| 2004/0075964 A1 | 4/2004 | Ker | |

* cited by examiner

*Primary Examiner*—Dao H Nguyen
(74) *Attorney, Agent, or Firm*—Winston Hsu

(57) ABSTRACT

An electrostatic discharge protection circuit has a substrate; a first P-well installed on the substrate and having a first P+-doped region and a first N+-doped region, both of which are connected to ground; a second P-well installed on the substrate and having a second P+-doped region and a second N+-doped region, both of which are connected to a power supply voltage; and a third P-well installed on the substrate and having a third N+-doped region, a third P+-doped region, and a fourth N+-doped region, all of which are for input/output signals.

12 Claims, 15 Drawing Sheets

ELECTROSTATIC DISCHARGE PROTECTION CIRCUIT

CROSS REFERENCE TO RELATED APPLICATIONS

This application is a continuation-in-part of applicant's earlier application, Ser. No. 10/904,080, filed Oct. 22, 2004, the entirety of which is incorporated by reference.

BACKGROUND OF THE INVENTION

1. Field of the Invention

The present invention relates to an electrostatic discharge (ESD) protection circuit, and more particularly, to an ESD protection circuit capable of executing any one of five existing integrated circuit test modes, a PS (Positive to VSS) test mode, an NS (Negative to VSS) test mode, a PD (Positive to VDD) test mode, an ND (Negative to VDD) test mode, and a DS (VDD to VSS) test mode.

2. Description of the Prior Art

In recent years, owing to a dramatic progress in integrated circuit (IC) technologies an IC, which is composed of a plurality of complementary metal oxide semiconductors (CMOSs), can have a size reduced from some microns to hundreds or even tens of deep-submicrons, to pursue goals of lower cost and better operation efficiency. However, a smaller IC has weaker ESD protection capability accordingly. For example, if an output buffer component is assumed to have a 300 micrometer channel width, an NMOS manufactured according to a two-micrometer conventional IC manufacturing process can have an ESD protection capability to endure an ESD voltage having a voltage level as high as three thousand volts, but another IC manufactured according to a one-micrometer lightly-doped drain process is capable of enduring an ESD voltage having a voltage level of only two thousand volts. Moreover, since electrostatic charges in an environment where an IC is located are constant and irrelevant with the size of the IC, an IC of a smaller size is easier to be damaged by ESD charges than a larger-sized IC. Therefore, as ICs become smaller, ESD protection circuits used to protect ICs from damage induced by ESD charges are becoming one of the most important types of electronic circuits.

In general, an ESD can be defined according to four models: a human-body model (HBM), a charged-device model (CDM), a machine model (MM), and a field-induced model (FIM). The HBM is described briefly as an example. A human's movement induces electrostatic charges. When the induced electrostatic charges exceed a threshold value and the human, on whom the electrostatic charges are accumulated, contacts an IC chip, the electrostatic charges will flow to ground through a pin and an inner circuit of the IC chip. Such an electrostatic discharging process induces a transient discharging current having a few amps, which is large enough to burn out the IC chip in a short period (hundreds of nanoseconds).

Please refer to FIG. 1, which is an equivalent circuit diagram illustrating an HBM model 10 and an ESD protection circuit 15 for preventing an IC chip 16 from damage induced by ESD charges generated by a human being according to the prior art. The ESD protection circuit 15 comprises an equivalent resistor 17 and an equivalent capacitor 19. The equivalent capacitor 19 is assumed to be one $C_{ESD}$ in capacitance. Initially, the ESD charges induced from the movement of the human will accumulate on an equivalent capacitor (100 pF) 12. When the human contacts the IC chip 16 (in equivalent, a switch 18 connects to point B.), the ESD charges accumulated on the equivalent capacitor 12 will travel to ground through an equivalent resistor 14 (1.5K $\Omega$), the equivalent resistor 17, and the equivalent capacitor 19 sequentially, without entering the IC chip 16. Thus, the IC chip 16 is free from damage induced by the ESD charges.

In general, five ESD test modes, a PS, an NS, a PD, an ND and a DS ESD test mode, are applied to evaluate an ESD protection capability of an IC chip. Please refer to FIG. 2, which is a schematic diagram illustrating how the PS ESD test mode evaluates the ESD protection capability of the IC chip 16 according to the prior art. The IC chip 16 comprises a $V_{SS}$ pin 24 electrically connected to ground, a pin 22, ready to be test, electrically connected to a positive test voltage 20, and a plurality of floated pins including a $V_{DD}$ pin 26.

According to the PS ESD test mode, the positive test voltage 20 is applied to the pin 22 with a first predetermined positive voltage a couple of times, usually three times, to test if the pin 22 is still robust despite the shock of the positive test voltage 20. The positive test voltage 20 is equivalent to ESD charges. If the pin 22 is still functioning normally, the positive test voltage 20 is raised to a second predetermined positive voltage and again applied to the pin 22 three times. The positive test voltage 20 is raised again and applied to the pin 22 until the pin 22 is damaged by the positive test voltage 20 of a predetermined positive voltage, which is called an ESD failure threshold. A plurality of methods, such as an absolute leakage current method, relative I-V drift method, and a function detection method, are used to determine if the pin 22 of the IC chip 16 is damaged due to ESD charges.

As mentioned earlier, there are five ESD test modes used to evaluate the ESD protection capability of the IC chip 16. The five test modes have five corresponding ESD failure thresholds different from each other. The ESD failure threshold of the pin 22 of the IC chip 16 calculated above corresponds only to the PS ESD test mode, one of the five ESD test modes. Moreover, in the IC chip 16 the ESD failure threshold of the pin 22 is usually different from that of any other pins even if they are evaluated according to an identical ESD test mode. The IC chip 16 cannot function normally unless all the pins can survive ESD charges. Therefore, a smallest ESD failure threshold in an ESD failure threshold group consisting of a plurality of ESD failure thresholds calculated according to the five ESD test modes governs, and is a genuine ESD failure threshold of the IC chip 16.

Because which of the ESD failure thresholds in the ESD failure threshold group is to be the genuine ESD failure threshold of the IC chip 16 is uncertain, the ESD protection circuit 15 that protects the IC chip 16 from damage induced by ESD charges having levels higher than the genuine ESD failure threshold has to have the capability to survive ESD charges provided by the five above-mentioned ESD test modes. Please refer to FIG. 3, which is a schematic diagram of the IC chip 16 according to the prior art. Each pin of the IC chip 16 has to be evaluated according to the five ESD test modes, as described previously, and the pin 22 acting as an input pad as well as an output pad is described here as an example. The IC chip 16 comprises an inner circuit 30 and five ESD protection circuits 32, 34, 36, 38 and 40 for protecting the inner circuit 30 from ESD charges provided by the five ESD test modes respectively. The ESD protection circuits 32 to 40 are dedicated to protect the inner circuit 30 from ESD charges, and therefore do nothing if the IC chip does not suffer any ESD charges.

The operation of the IC chip 16 under ESD charges in accordance with the ND ESD test mode is described briefly as follows: Current induced by the ESD charges flows from the $V_{DD}$ pin 26, through the ESD protection circuits 36 and 32, along the $V_{SS}$ pin 24, through the ESD protection circuit 34 and the input pad 22, and eventually to a negative test voltage 42. According to such a scenario, the IC chip 16 is free from the impact induced by the negative test voltage 42, the ESD charges in equivalence.

A variety of CMOS ICs, such as diffusion or poly resistors, p-n junction diodes, MOS components, bipolar junction transistors, and silicon-controlled rectifier (SCR) components, are implemented to form ESD protection circuits. These components have distinct characteristics and ESD protection capability.

For example, since a forward-biased diode has a working voltage (about 0.8 to 1.2 volts) far smaller than that (about −13 to −15 volts) of a reverse-biased diode, and heat generated by the forward-biased diode is accordingly far smaller than that of the reverse-biased diode if ESD currents flowing through these two diodes are equal. The forward-biased diode has an ESD protection capability far superior to that of the reverse-biased diode if their sizes are equal. A diode that an ESD protection circuit comprises is usually forward-biased. However, an ESD protection circuit having a diode installed has to comprise an additional component such as a resistor. On the other hand, since both a reverse-biased and a forward-biased SCR component have a constant working voltage equal to one volt, an SCR component of small size still has satisfactory ESD protection capability. Manufactured according to an identical process, an SCR component has an ESD protection capability per unit area is superior to that of any of the diffusion or poly resistors, the p-n junction diodes, the MOS components, and the bipolar junction transistors.

The above-mentioned MOS ICs can be composed to form a variety of ESD protection circuits. Please refer to FIG. 4 and FIG. 5, which are two circuit diagrams of two ESD protection circuits 50 and 60 electrically connected between the pin 22 and the inner circuit 30 for protecting the inner circuit 30 from damage induced by ESD charges. Both of the ESD protection circuits 50 and 60 are composed of at least two of the above-mentioned MOS ICs. The ESD protection circuit 50 comprises a resistor 52 and two cascaded diodes 54 and 56. The ESD protection circuit 60 comprises two cascaded resistors 62 and 64, an SCR component 66, and a field-oxide device 68. The ESD protection circuit 50 has an ESD capability superior to that of the ESD protection circuit 40.

As mentioned previously, an ESD capability of an ESD protection circuit relates to the MOS ICs that the ESD protection circuit comprises. However, any improvement of these MOS ICs also has the benefit of promoting the ESD protection capability of the ESD protection circuit. In general, the ESD protection capability of a CMOS component can be improved in three aspects including manufacturing process, the component itself and circuit design.

As far as the first aspect of the manufacturing process is concerned, although a variety of techniques such as implanting an LDD structure into a CMOS, applying Silicided diffusion to a diffusion layer of a MOS component, reducing stray serial resistance on the gate of a MOS component with Polycide, and adopting a process consisting of Silicided diffusion and Polycide, can be used to increase the density and operation speed of an inner circuit of a MOS, the MOS has a poor ESD protection capability and is susceptible to ESD charges. Two manufacturing processes, an ESD-implant process and a silicided-diffusion blocking process, are used to solve the above problem. The ESD-implant process executes an ion implanting process one more time on a drain of a CMOS, so that currents flowing through the drain are evenly distributed and the CMOS has a better ESD protection capability. The silicided-diffusion blocking process has a capability to control a ballasting resistor between the drain and gate of the MOS component, so as to increase the operation speed of the CMOS component.

As far as the second aspect of the component itself is concerned, a well-known low-voltage triggering SCR (LVTSCR) is described briefly as an example. The LVTSCR comprises a $P^+$ diffusion layer, an N-well layer, a P-substrate layer, and an $N^+$ diffusion layer. Having a high junction breakdown threshold, about 30 to 50 volts, the LVTSCR has to have an additional clamp circuit installed. When turned on due to an ESD voltage induced by ESD charges, the LVTSCR generates a clamping voltage, which has a capability to protect an inner circuit protected by the LVTSCR by clamping the ESD voltage down to a low voltage level.

As far as the third aspect of the circuit design is concerned, a gate-coupled technique applied to NMOS components, a gate-grounded technique, and a substrate-triggered technique are three popular techniques. A large-sized component usually has a finger-typed layout. However, these fingers connected in parallel are usually not conducted to release an ESD current simultaneously. This is the reason why an ESD protection capability of a component is not proportional to a size of the component. The substrate-triggered technique is capable of improving the ESD protection capability of a component by uniformly conducting all of the fingers according to a capacitance effect. The gate-grounded technique is capable of releasing ESD current effectively by electrically connecting a drain and a gate of a MOS component to a pin and to ground respectively and conducting a parasitic bipolar junction diode (BJT) of the MOS component. The gate-coupled technique offers a great contribution to conduct the parasitic BJT by controlling a voltage level of the gate with a capacitance coupling method. As described previously, five ESD test modes have to be used to evaluate an ESD protection capability, and a single MOS is capable of achieving at least two ESD test modes, so an ESD protection circuit has to comprise at least three MOS components.

In general, an ESD protection circuit of the prior art has at least the following disadvantages:

1. The ESD protection circuit will impose a load effect on an inner circuit and reduces the efficiency as a whole;

2. The ESD protection circuit generates a large leakage current and has a great power consumption;

3. The ESD protection circuit needs a driving voltage having a high voltage level and releases ESD currents inefficiently;

4. The ESD protection circuit cannot protect itself from damage induced by ESD charges, and has a poor ESD protection capability to protect an inner circuit protected by the ESD protection circuit;

5. The ESD protection circuit does not have uniformly distributed currents, so that even if the ESD protection circuit has an area dramatically increased, an ESD protection capability of the ESD protection circuit still only increases slightly;

6. The ESD protection circuit has to comprise at least to three ESD components to achieve all of the five ESD test modes;

7. An additional process such as an ESD implant process is used to fabricate the ESD protection circuit, making the ESD protection circuit have a higher cost; and 8. The ESD protection circuit cannot be applied to a broadband radio circuit.

SUMMARY OF THE INVENTION

The present invention provides an ESD protection circuit to solve the above-mentioned problems.

According to the claimed invention, the ESD protection circuit includes a substrate, a first P-well, a second P-well, and a third P-well, all of which are installed on the substrate. The first P-well includes a first P+ region and a first N+ region, both of the first P+ and the first N+ regions connected to ground. The second P-well includes a second P+ region and a second N+ region, both of the second P+ and the second N+ regions connected to a voltage source. The third P-well includes a third N+ region, a third P+ region and a fourth N+ region, all of the third N+ region, the third P+ region and the fourth N+ region for inputting/outputting signals.

According to the preferred embodiment, the substrate is an N-substrate, and the ESD protection circuit further includes polysilicon disposed on all the regions.

Since the ESD protection circuit of the present invention is capable of achieving all of the five EDS test modes, an additional clamp circuit is omitted. Moreover, the poly-silicon silicon disposed on all the regions strengthens the ESD protection capability of the ESD protection circuit.

The present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

DETAILED DESCRIPTION

Figure 6:
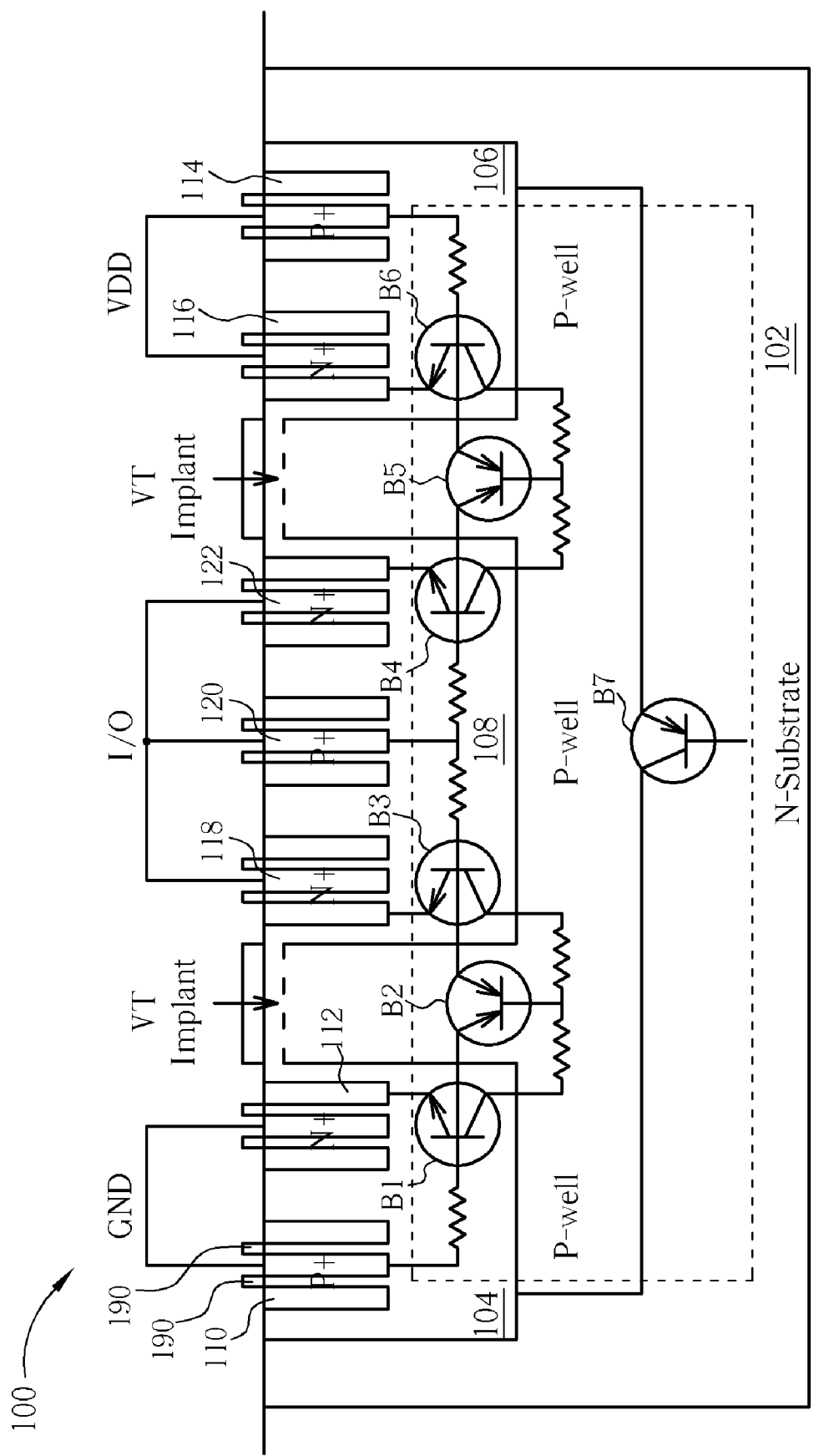
FIG. 6 is a cross-sectional diagram of an ESD protection circuit of the preferred embodiment according to the present invention.

Please refer to FIG. 6, which is a cross-sectional diagram of an ESD protection circuit 100 of the preferred embodiment according to the present invention. The ESD protection circuit 100 comprises an N-substrate 102, a first P-well 104, a second P-well 106, and a third P-well 108, all of the P-wells being installed on the N-substrate 102. The first P-well 104 comprises a first $P^+$ region 110 and a first $N^+$ region 112, both of which are used for connecting to GND pads of an integrated circuit chip. The second P-well 106 comprises a second $P^+$ region 114 and a second $N^+$ region 116, both of which are used for connecting to VDD pads of the integrated circuit chip. The third P-well 108 comprises a third $N^+$ region 118, a third $P^+$ region 120 and a fourth $N^+$ region 122, all of which are used for connecting to I/O pads of the integrated circuit chip.

The left-hand part of the ESD protection circuit 100 consisting of five layers of N-P-N-P-N, that is, the first $N^+$ region 112, the first $P^+$ region 104, the N-substrate 102, the third $P^+$ region 108, and the third $N^+$ region 118, can be regarded as equivalent to three serially connected bipolar transistors $B_1$, $B_2$ and $B_3$, or two silicon-controlled rectifier (SCR) components $SCR_1$ (bipolar transistors $B_1$-$B_2$) and $SCR_2$ (bipolar transistors $B_2$-$B_3$). The ESD 100 therefore has an operation mechanism similar to that of the prior art SCR component.

The operation of the ESD protection circuit 100 is described as follows: When a positive ESD voltage having a voltage level higher than a predetermined voltage level is generated (PS ESD test mode), a junction breakdown occurs between the N-substrate 102 and the first P-well 104, and an ESD current corresponding to the positive ESD voltage flows through the first $P^+$ region 110 of the first P-well 104 to the GND pads of the integrated circuit chip, so as to protect inner circuits of the integrated circuit chip from damage induced by the ESD current. In equivalence, the $SCR_1$, is operating during PS ESD test mode. On the contrary, when a negative ESD voltage having an absolute voltage level higher than the predetermined voltage level is generated (NS ESD test mode), a junction breakdown occurs between the N-substrate 102 and the third P-well 108, and an ESD current corresponding to the negative ESD voltage flows through the third $P^+$ region 120 of the third P-well 108 to the I/O pads of the integrated circuit chip. In equivalence, the $SCR_2$ is operating during NS ESD test mode.

Similarly, the right-hand part of the ESD protection circuit 100 consisting of the second $N^+$ region 116, the second $P^+$ region 106, the N-substrate 102, the third $P^+$ region 108, and the fourth $N^+$ region 122 is capable of releasing ESD currents corresponding to ESD voltages of both PD and ND ESD test modes. Further redundant descriptions are omitted. In contrast to the dual-SCR ESD protection circuit of the prior art having to have the clamp circuit additionally installed to perform DS ESD test mode, the ESD protection circuit 100 having an equivalent bipolar transistor $B_7$ composed of the first P-well 104, the N-substrate 102 and the second P-well 106 is capable of releasing an ESD current flowing from VDD to GND during DS ESD test mode.

In order to control a drive voltage $V_T$ of the ESD protection circuit 100 effectively, a $V_T$ implant layer that a MOS process usually adopts is installed between the first P-well 104 and the third P-well 108 and between the third P-well 108 and the second P-well 106 of the N-substrate 102. Therefore, a pseudo MOS structure formed between the first $N^+$ region 112 of the first P-well 104 and the third $N^+$ region 118 of the third P-well 108 (another pseudo MOS structure is formed between the fourth $N^+$ region 122 of the third P-well 108 and the second $N^+$ region 116 of the second P-well 106) conducts a slight current induced from an inner coupling capacitor, and the ESD voltage having the high voltage level reduces a voltage barrier of the third $N^+$ region 118 of the third P-well 108 (and the fourth $N^+$ region 122 as well) and enables the pseudo MOS structure to conduct more currents, a slightly-conducted pseudo MOS having the benefit of reducing the drive voltage $V_T$ of the ESD protection circuit 100.

Figure 7:
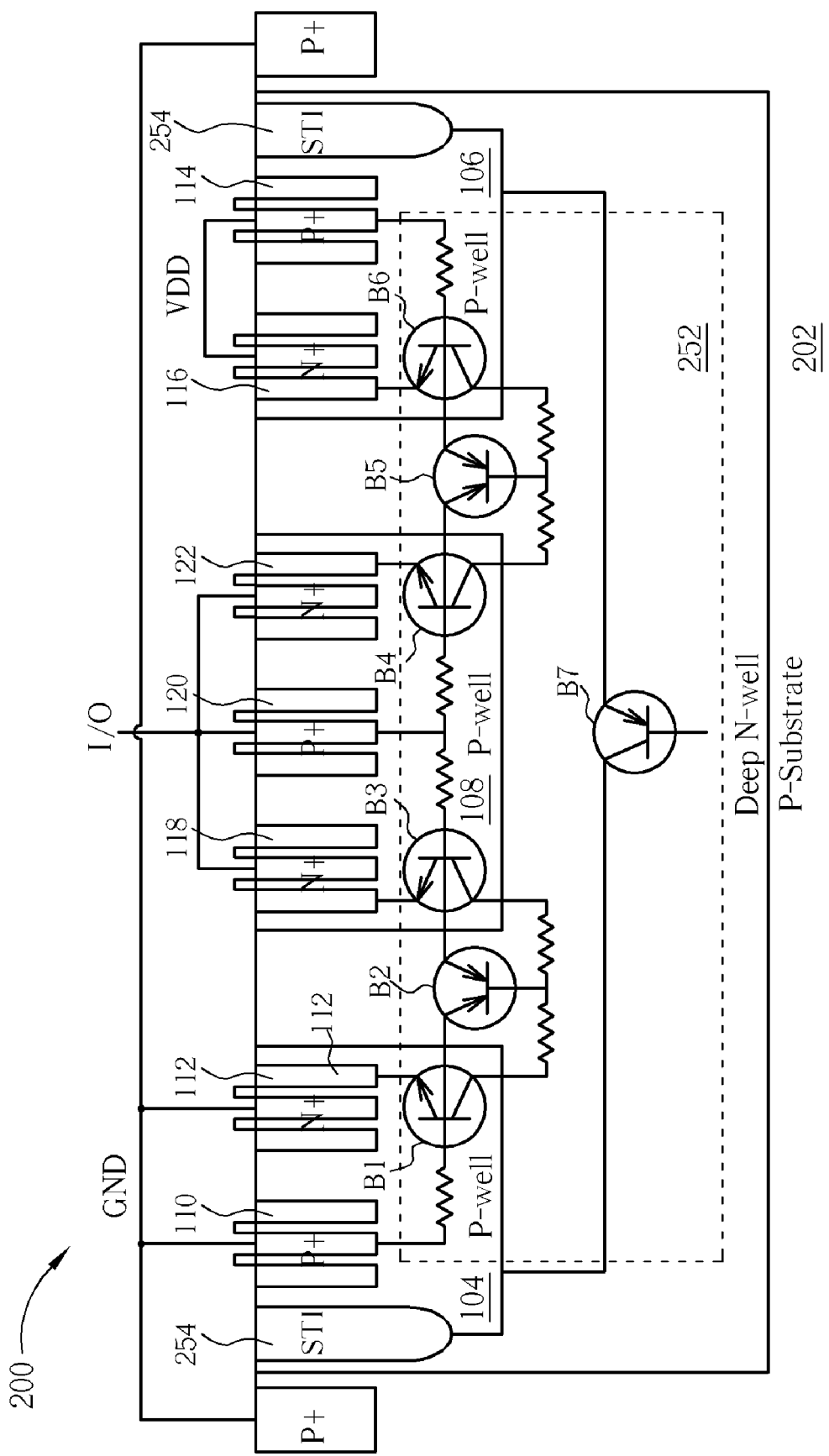
FIG. 7 is a cross-sectional diagram of an ESD protection circuit of a second embodiment according to the present invention.

The ESD protection circuit 100 shown in FIG. 6 is fabricated according to a general semiconductor fabrication process. Of course, an advanced semiconductor fabrication process can be applied here to fabricate an ESD protection circuit of the present invention. Please refer to FIG. 7, which is a cross-sectional diagram of a triple-welled ESD protection circuit 200 of a second embodiment according to the present invention. A reverse-biased voltage between a P-substrate 202 and a deep N-well 252 has a capability to reduce a latent leakage current of the ESD protection circuit 200. Additionally, a first shallow trench isolation (STI) layer 254 installed by the side of the first $P^+$ region 110 of the first P-well 104, as well as a second STI layer 256 installed by the side of the second $P^+$ region 114 of the second P-well 106, has a capability to restrict the movement of ions in the ESD protection circuit 200, so as to reduce the possibility that the ions flow to a region outside of the first P-well 104 and of the second P-well 106. The ESD protection circuit 200 has an operation mechanism similar to that of the ESD protection circuit 100, redundant description being omitted.

Figure 1:
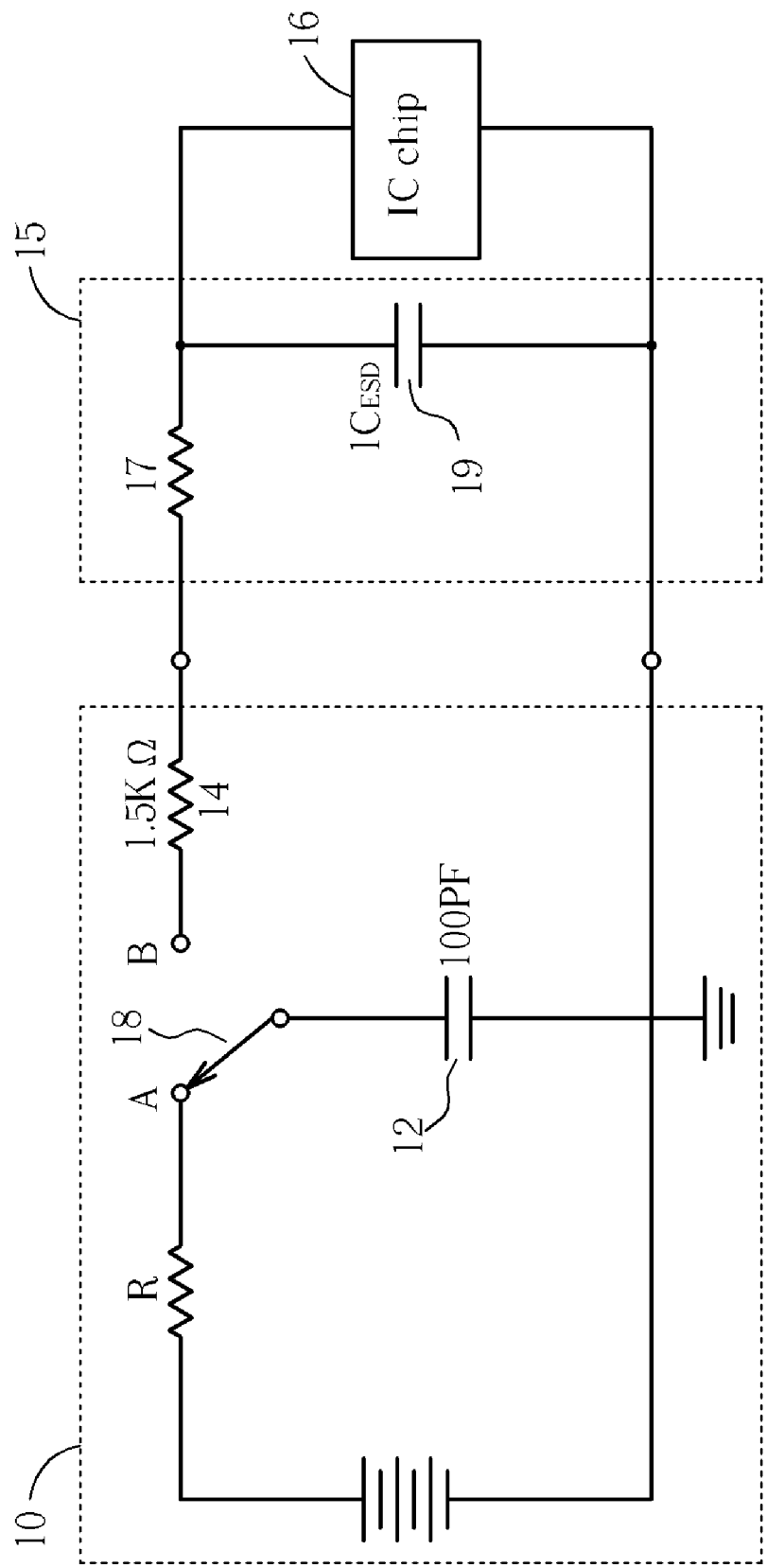
FIG. 1 is an equivalent circuit diagram of an HBM model and an ESD protection circuit according to the prior art.
Figure 2:
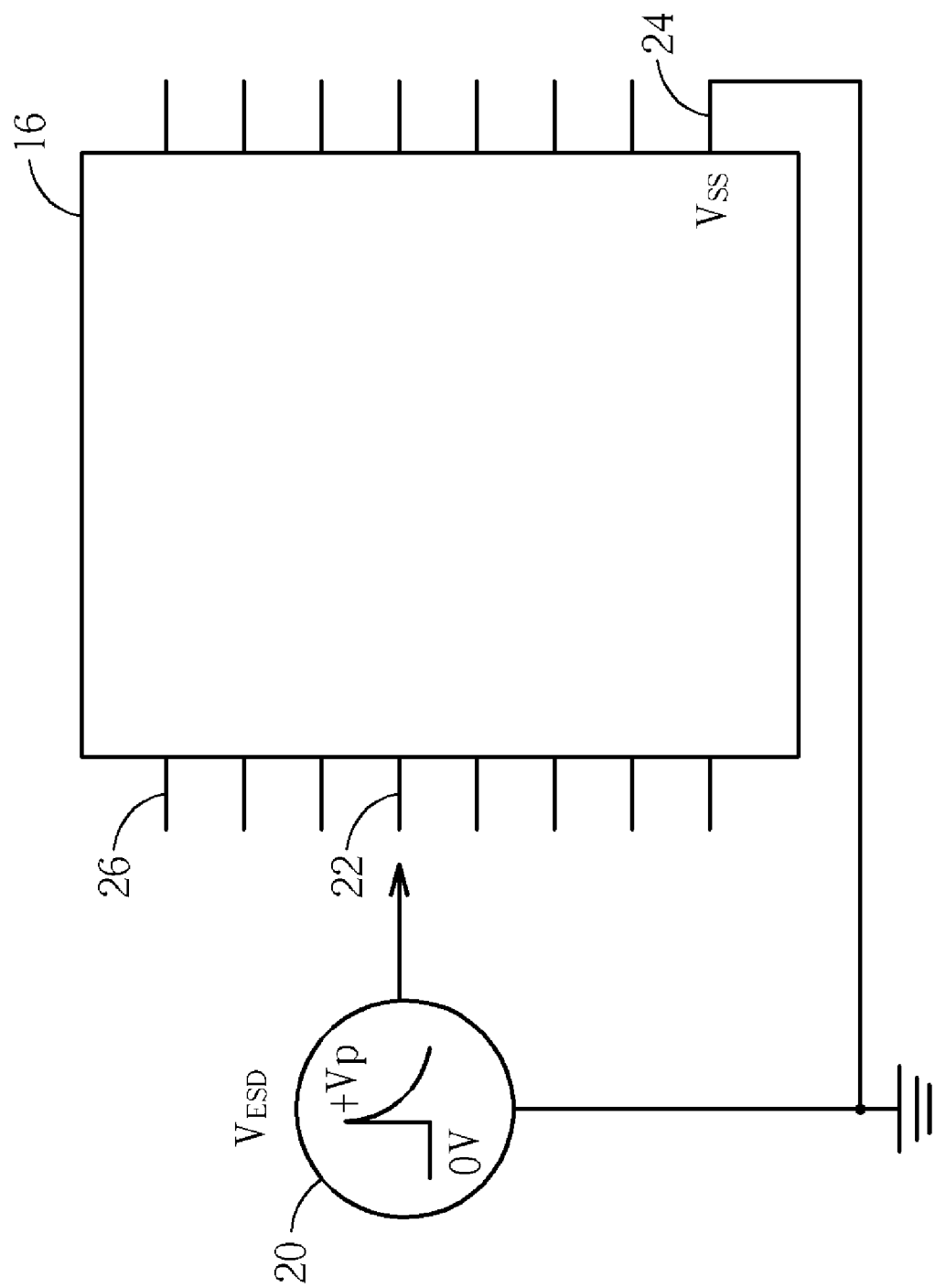
FIG. 2 is a schematic diagram illustrating how a PS ESD test mode evaluates the ESD protection capability of an IC chip shown in FIG. 1 according to the prior art.
Figure 3:
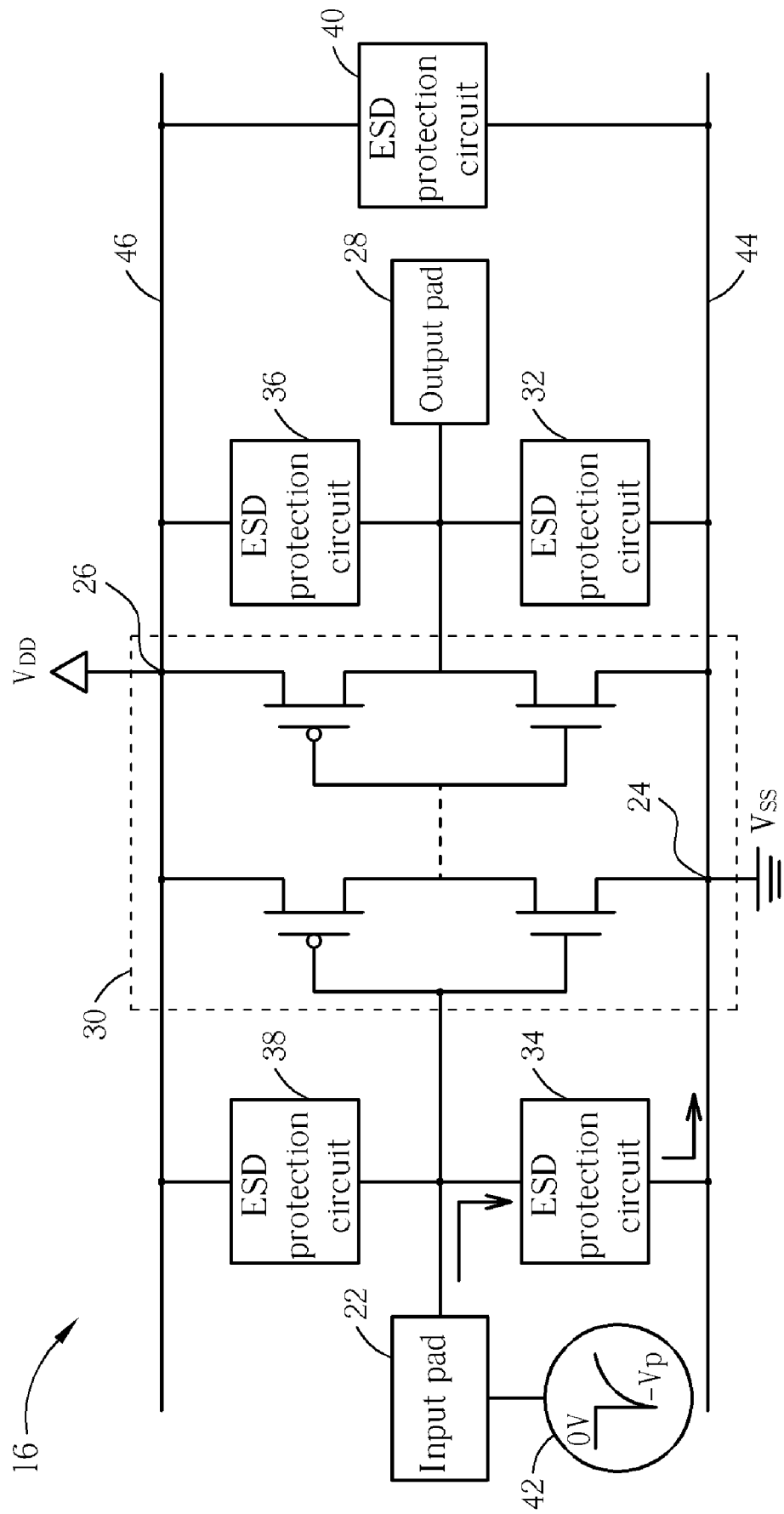
FIG. 3 is a schematic diagram of the IC chip shown in FIG. 2 according to the prior art.
Figure 4:
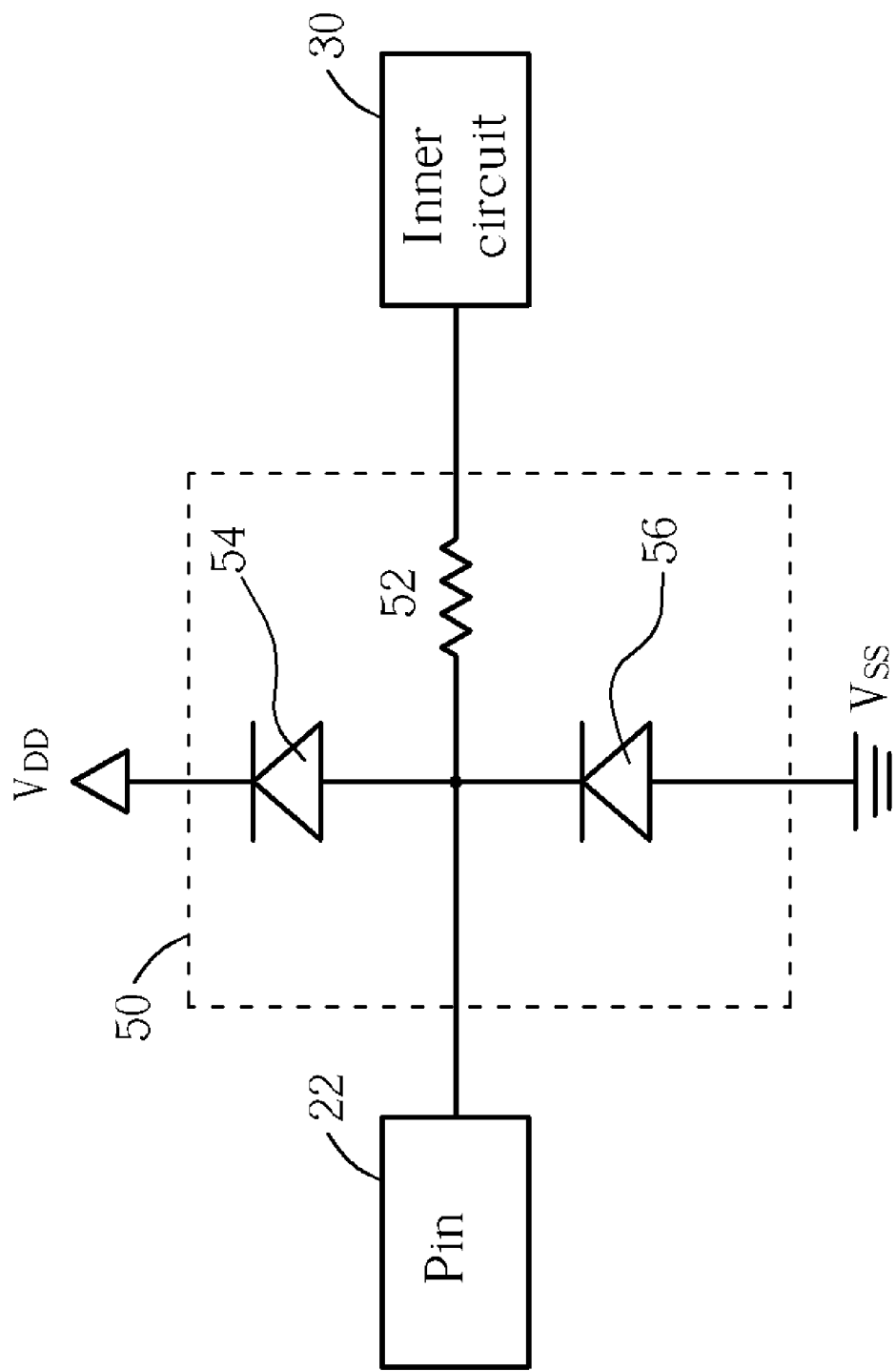
FIG. 4 and FIG. 5 are two circuit diagrams of two ESD protection circuits, each of which is composed of at least two MOS ICs, according to the prior art.
Figure 5:
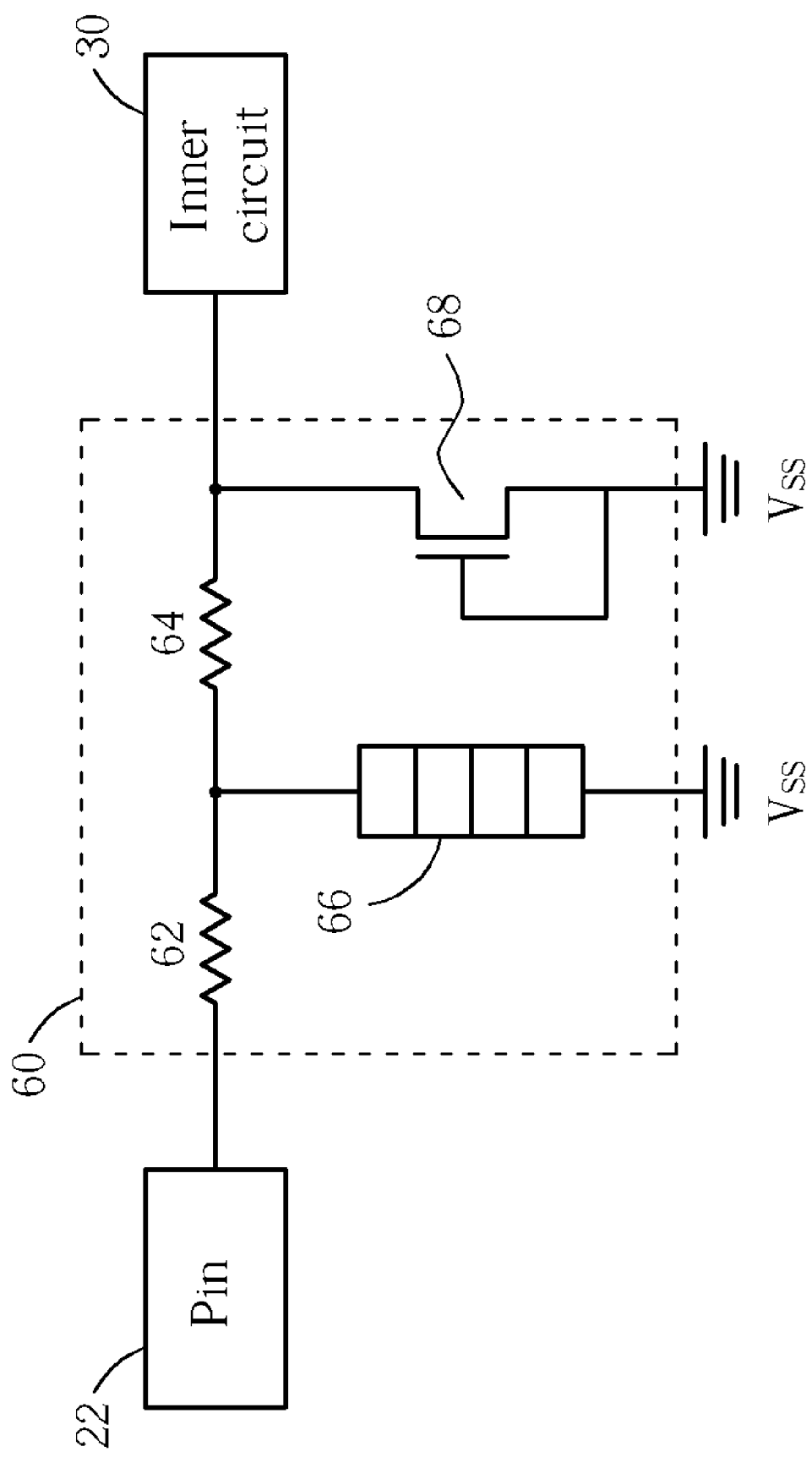

As shown in FIG. 1, the ESD protection circuit 15 of the prior art can be simplified to an equivalent circuit having the equivalent resistor 17 and the equivalent capacitor 19 only. In order to release an ESD current induced by an electrostatic voltage effectively, the equivalent capacitor 19 usually has to have a capacitance value larger than 300 fF. The equivalent capacitance 19 having such a high capacitance value not only increases the area that the ESD protection circuit 15 has to occupy, to make matters worse, the equivalent capacitor 19 also reduces the efficiency of a circuit (the integrated circuit chip 16 protected by the ESD protection circuit 15 due to a load effect introduced by a load $R_{load}$ shown in FIG. 8). However, a concept of a distributed amplifier widely applied to microwave circuits is introduced to an ESD protection circuit of the present invention to solve the above problem.

Figure 8:
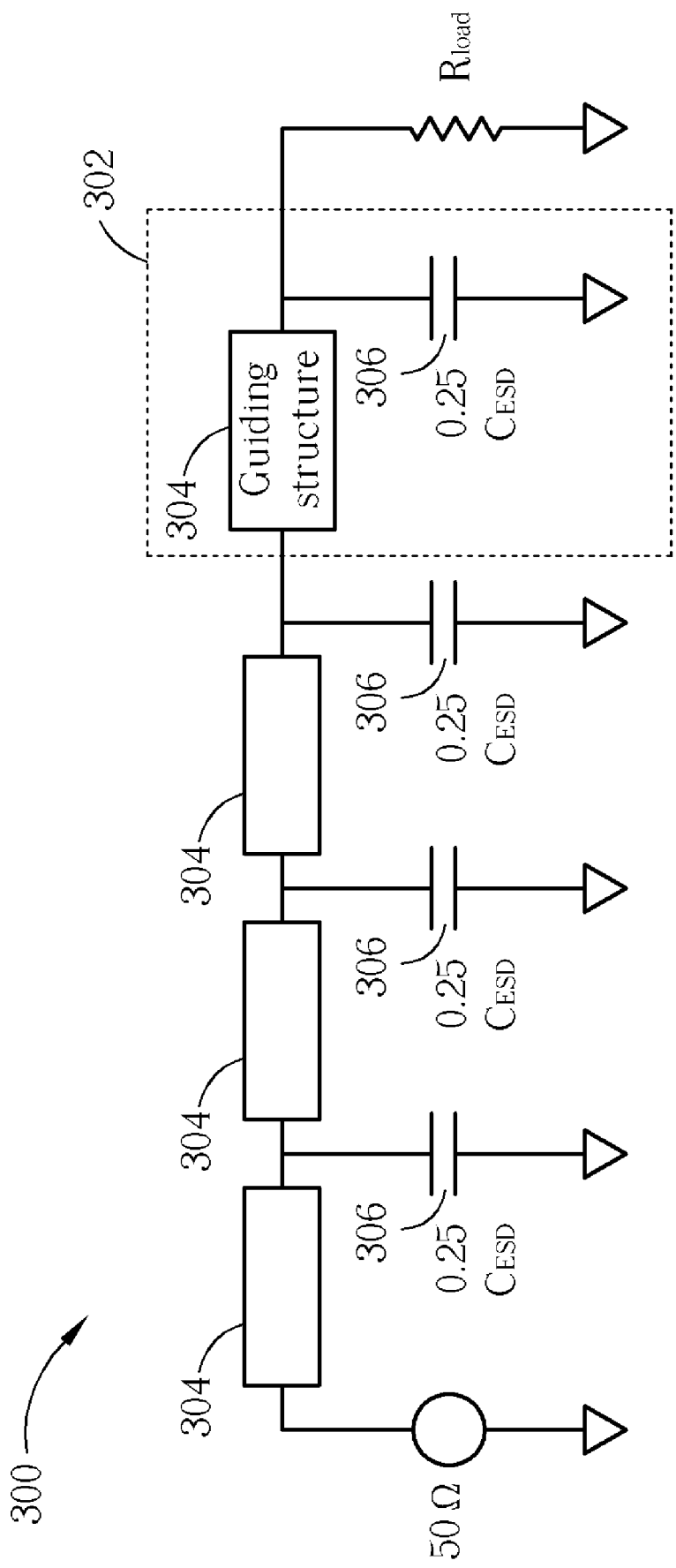
FIG. 8 is a cross-sectional diagram of an ESD protection circuit of a third embodiment according to the present invention.

Please refer to FIG. 8, which is an equivalent circuit of an ESD protection circuit 300 of a third embodiment according to the present invention. The ESD protection circuit 300 is fabricated according to the concept of a distributed amplifier. Different from the ESD protection circuit 15 having the single equivalent capacitor 19 and the single equivalent resistor 17 (single-staged), the ESD protection circuit 300 comprises four serially connected ESD protection units 302. Each of the ESD protection units 302 comprises an equivalent capacitor 306 and a coplanar wave-guide (CPW) 304, which can be replaced with a transmission line 304. The CPW 304 can be made of a plurality of metal layers according to a semiconductor fabrication process and acts as a guiding structure of the ESD protection unit 302. Each of the equivalent capacitor 306 of the ESD protection unit 302 is assumed to be 0.25 $C_{ESD}$ in capacitance.

The ESD protection circuit 300 has a total capacitance value, which is equal to a sum of four capacitance values of the four equivalent capacitors 306, as large as that of the ESD protection circuit 15, so both the area and the capability to release an electrostatic current of the ESD protection circuit 300 are the same as those of the ESD protection circuit 15. However, to the circuit protected by the ESD protection circuits 300 and 15, since the ESD protection circuit 300 has a capacitance value one quarter as large as that of the ESD protection circuit 15, the load effect imposed on the circuit by the ESD protection circuit is accordingly far less than that by the ESD protection circuit 15. In conclusion, if the load effects respectively imposed by the ESD protection circuit 300 and 15 on the circuit are equal, not only is an area that the ESD protection circuit 300 needs to occupy smaller than that of the ESD protection circuit 15, the ESD protection circuit 300 also has a current-releasing capability superior to that of the ESD protection circuit 15.

The ESD protection circuit 300 further comprises a matching impedance of 50 ohms. The CPW 304 of the ESD protection circuit 300 can be regarded as an equivalent inductor 304 for matching with the matching impedance according to an inductance compensation effect, while the equivalent capacitor 306 can be used to protect a broadband circuit from the damage induced by ESD charges.

In addition to the advantages mentioned above, the ESD protection circuit 300, which is formed according to the concept of a distributed amplifier, can be further applied to protect a variety of radio circuits, such as a narrowband radio circuit, a broadband radio circuit and even an ultra-broad band radio circuit, whose bandwidths are diversified, by including a moderate number of ESD protection units. Since an ESD protection circuit formed according to the concept of a distributed amplifier has a corner frequency $\omega_c$ relating to the number of ESD protection units of the ESD protection circuit, i.e.

$$\omega_c = \sqrt{\frac{4n^2 + \omega_0^2 Z_0^2 C^2}{Z_0^2 C^2}},$$

an ESD protection circuit of the present invention can be used to protect a circuit operating on a specified corner frequency by including a specified number of ESD protection units according to the specified corner frequency. For example, if the circuit protected by an ESD protection circuit of the present invention is a narrowband radio circuit, the ESD protection circuit can include only one ESD protection unit. In general, an ESD protection circuit having four ESD protection units according to the present invention is robust enough to protect a radio circuit having a bandwidth of 10 GHz.

In order to reduce parasitic capacitances, pads of an integrated circuit should form of an octagon, so an ESD protection circuit of the present invention has an octagonal layout in accordance with the octagon-formed pads. Please refer to FIG. 9, which is a layout diagram of the ESD protection circuit 100 (any one of the ESD protection units 306 of the ESD protection circuit 300 shown in FIG. 8) according to the present invention. The layout comprises a central region. The third P-well 108 is installed in a central region, the first P-well 104 is installed above the central region, and the third P-well 106 is installed below the central region. In order to prevent a junction between any one of all the P-wells and the N⁺ region thereof from breaking down due to a reverse-biased voltage induced by an ESD current concurrently received by the P⁺ and N⁺ regions of the P-well, any one of the four N⁺ regions, i.e. the first, second, third, and fourth N⁺ regions 112, 116, 118, and 122, is designed to have an area smaller than that of any one of the first, second, and third P⁺ regions 110, 114 and 120.

In addition to the advantage of reducing the area of the integrated circuit chip, since parasitic capacitances on the four corners of a rectangular layout are larger than those on the eight corners of an octagonal layout, the octagonal ESD protection circuit 100 has a parasitic capacitance 83% of that of the rectangular ESD protection circuit of the prior art. The ESD protection circuit 100 having smoother corners further has an additional capability to reduce unnecessary microwave effects.

Figure 9:
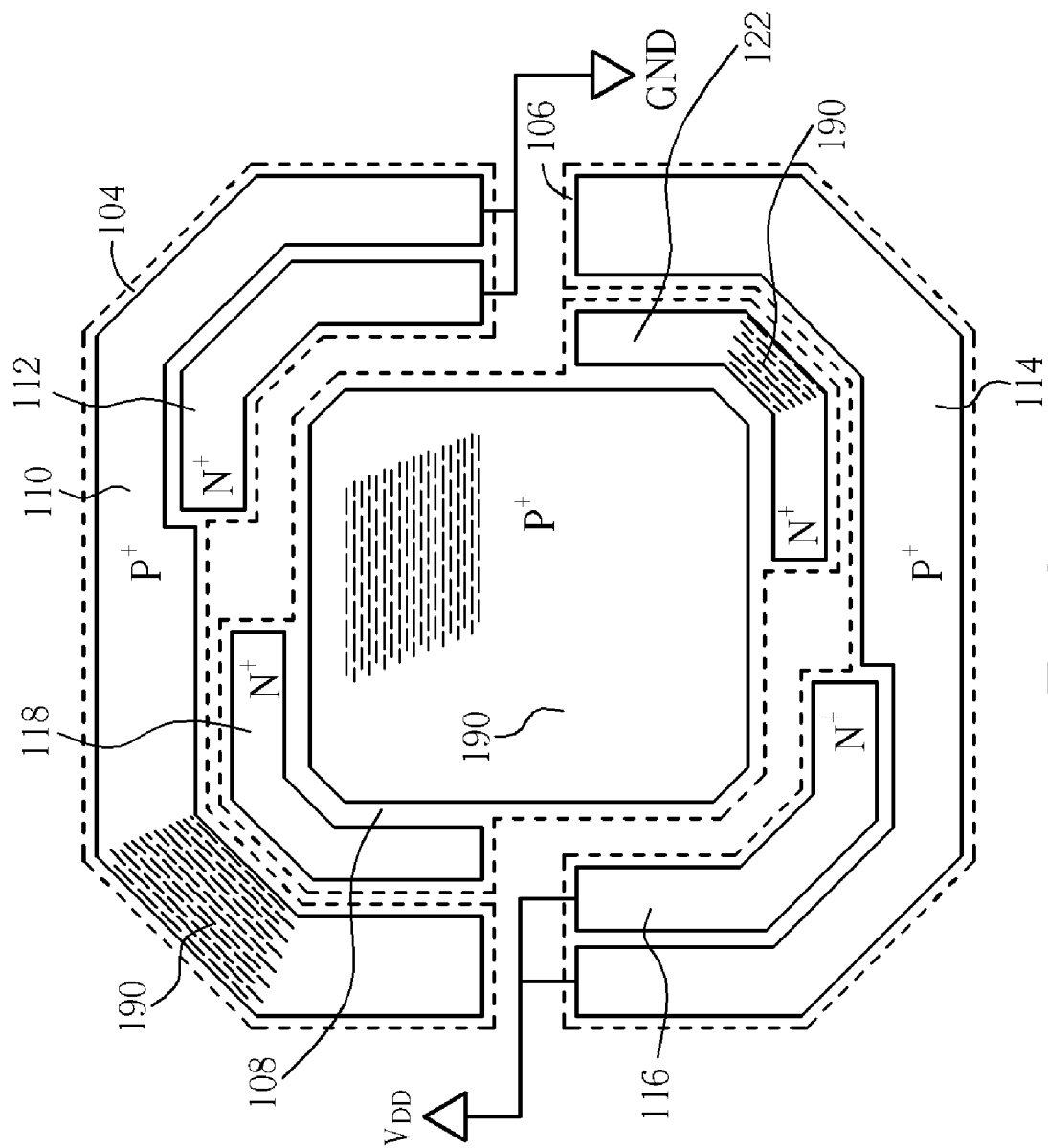
FIG. 9 is a layout diagram of the ESD protection circuit shown in FIG. 6 according to the present invention.
Figure 10:
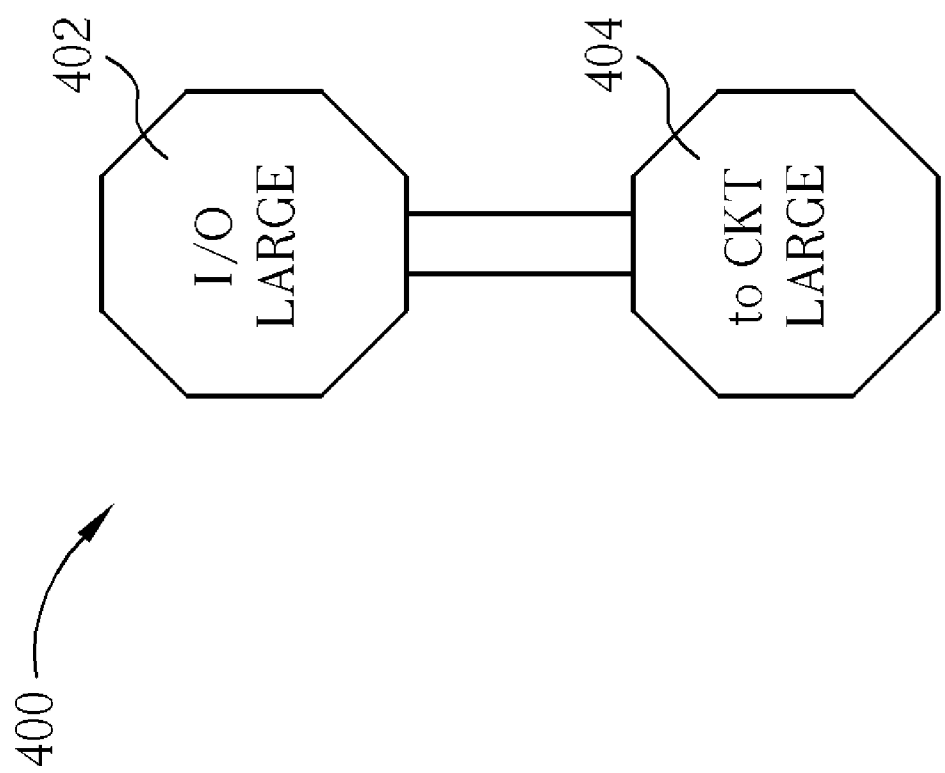
FIG. 10 is a layout diagram of a two-staged ESD protection circuit of a fourth embodiment applied to a broadband circuit according to the present invention.
Figure 11:
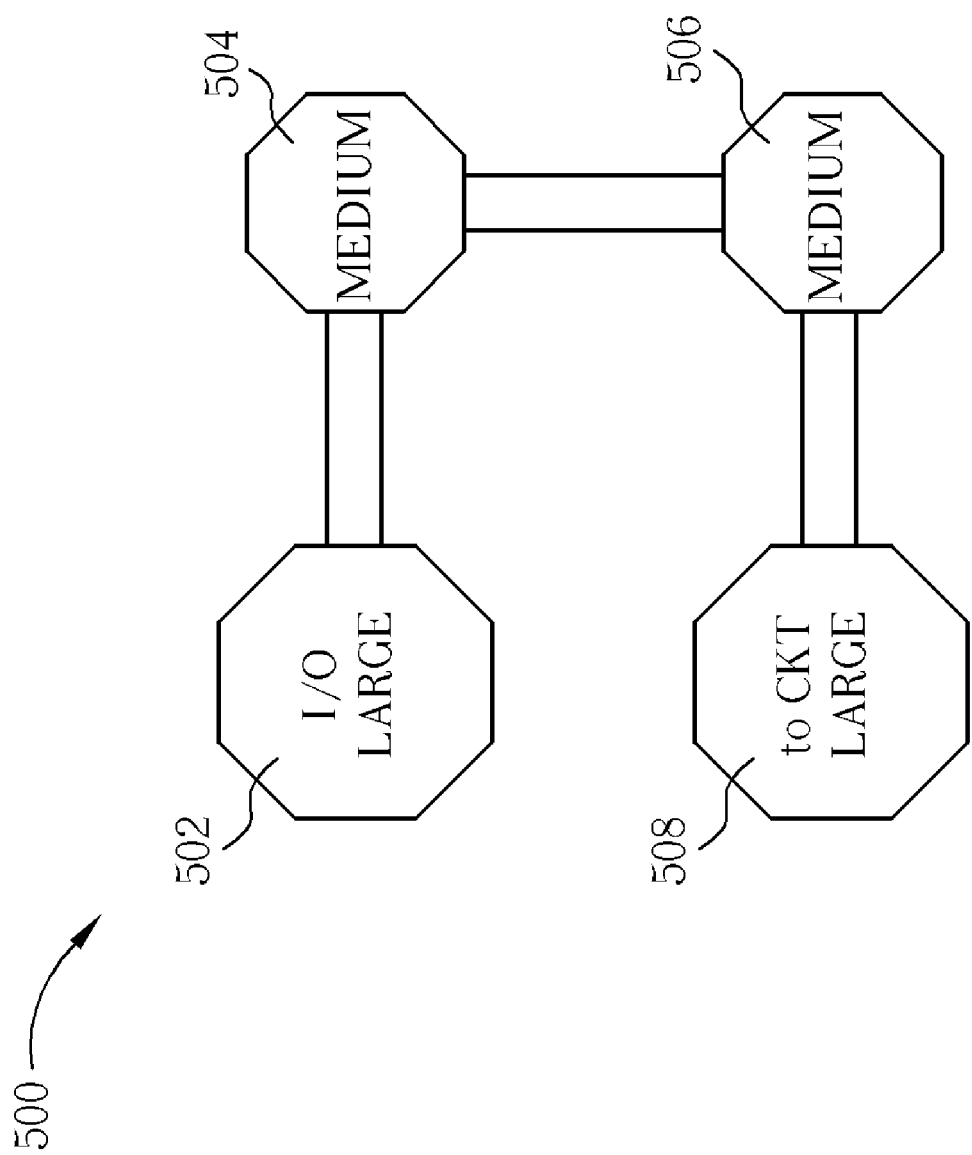
FIG. 11 is a layout diagram of a four-staged ESD protection circuit of a fifth embodiment applied to a broadband circuit according to the present invention.

The ESD protection circuit 100 shown in FIG. 9 is dedicated to a narrowband radio circuit. The ESD protection circuit 300 comprises only one ESD protection unit 302 and is robust enough to meet all demands required by a narrowband radio circuit. In contrast to the ESD protection circuit 100 comprising only one ESD protection unit 302 and applied to a narrowband radio circuit, an ESD protection circuit of the present invention can comprise more than two cascaded ESD protection units and be applied to a broadband, and even an ultra-broad band radio circuit. Please refer to FIG. 10 and FIG. 11. FIG. 10 is a layout diagram of a two-staged ESD protection circuit 400 (comprising two cascaded ESD protection units 302) applied to a broadband radio circuit of a fourth embodiment according to the present invention. FIG. 11 is a layout diagram of a four-staged ESD protection circuit 500 (comprising four cascaded ESD protection units 302) applied to an ultra-broad band radio circuit of a fifth embodiment according to the present invention. The ESD protection circuit 400 comprises a first stage ESD protection unit 402 electrically connected to a pin of an integrated circuit chip, and a second stage ESD protection unit 404 electrically connected to an inner circuit (for example, the broadband radio circuit) of the integrated circuit chip. The ESD protection circuit 500 comprises a first stage ESD protection unit 502 electrically connected to a pin of an integrated circuit chip, a fourth stage ESD protection unit 508 electrically connected to an inner circuit of an integrated circuit chip, a second stage ESD protection unit 504 electrically connected to the first stage ESD protection unit 502, and a third stage ESD protection unit 506 electrically connected to the fourth stage ESD protection unit 506.

The four ESD protection units of the ESD protection circuit 500 shown in FIG. 11 have a layout in the shape of an open rectangle. However, the four ESD protection units can have a linear layout and be disposed along an edge of an integrated circuit chip. Since each of the pins of an integrated circuit chip needs a dedicated ESD protection circuit, and two neighboring pins have a limited distance between them, in order not to occupy too much space of the border having only a finite length, the four ESD protection units 502, 504, 506 and 508 are strongly recommended to have the open rectangle layout shown in FIG. 11. Of course, an ESD protection circuit of the present invention can comprise three cascaded ESD protection units (not shown in Figures).

In an ESD protection circuit of the present invention, since an inductor made of a transmission line has a predetermined delay, an ESD protection unit directly contacting a pin of an integrated circuit chip, such as the first stage ESD protection unit 502 shown in FIG. 11, has to have a layout of a larger area, so as to protect the ESD protection circuit 500 from damage. Moreover, in order to survive unexpected microwave glitches coming from an inner circuit, an ESD protection unit directly contacting the inner circuit, such as the fourth stage ESD protection unit 508 shown in FIG. 11, also has to have a layout of a larger area. As shown in FIG. 11, either of the first and the fourth ESD protection units 502 and 508 (on which a label "LARGE" is marked) has an area larger than that of either of the second and the third ESD protection units 504 and 506 (on which a label "MEDIUM" is marked). Because of the larger area, the first and the fourth ESD protection units 502 and 508 also have larger capacitance values than that of either of the second and the third ESD protection units 504 and 506.

Figure 12:
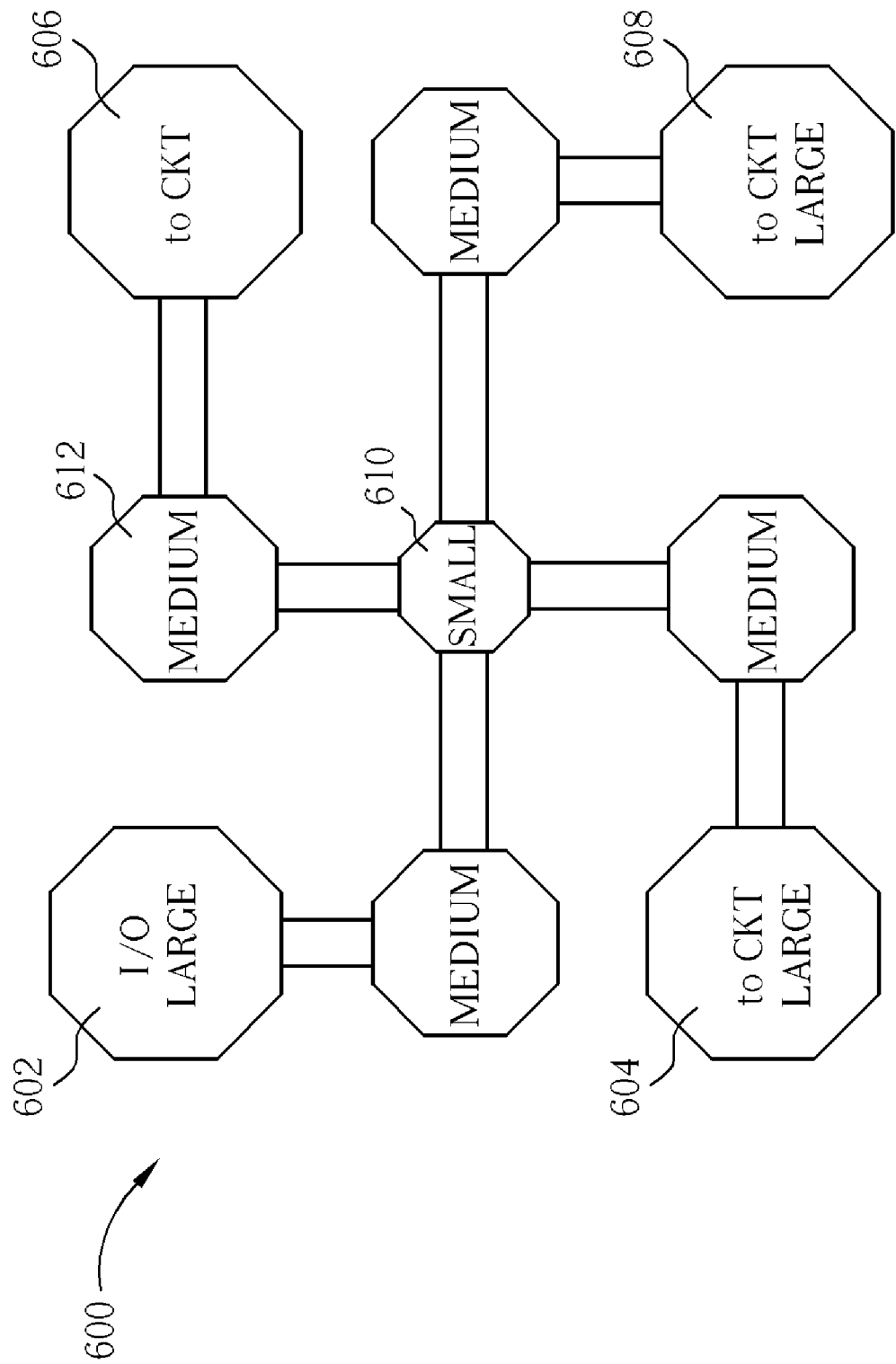
FIG. 12 is a layout diagram of a four-staged ESD protection circuit of a sixth embodiment applied to an ultra-broad band circuit according to the present invention.

Please refer to FIG. 12, which is a layout diagram of a five-staged ESD protection circuit 600 applied to an ultra-broad band of a sixth embodiment according to the present invention. Different from the first stage ESD protection unit 502, which is electrically connected to a single inner circuit via the single fourth stage ESD protection unit 508, a first stage ESD protection unit 602 of the ESD protection circuit 600 is electrically connected to three inner circuits via three fourth stage ESD protection units 604, 606 and 608 respectively. The ESD protection circuit 600 having such a layout shown in FIG. 12 is recommended to be applied to a pin disposed on a corner of an integrated circuit chip.

Figure 13:
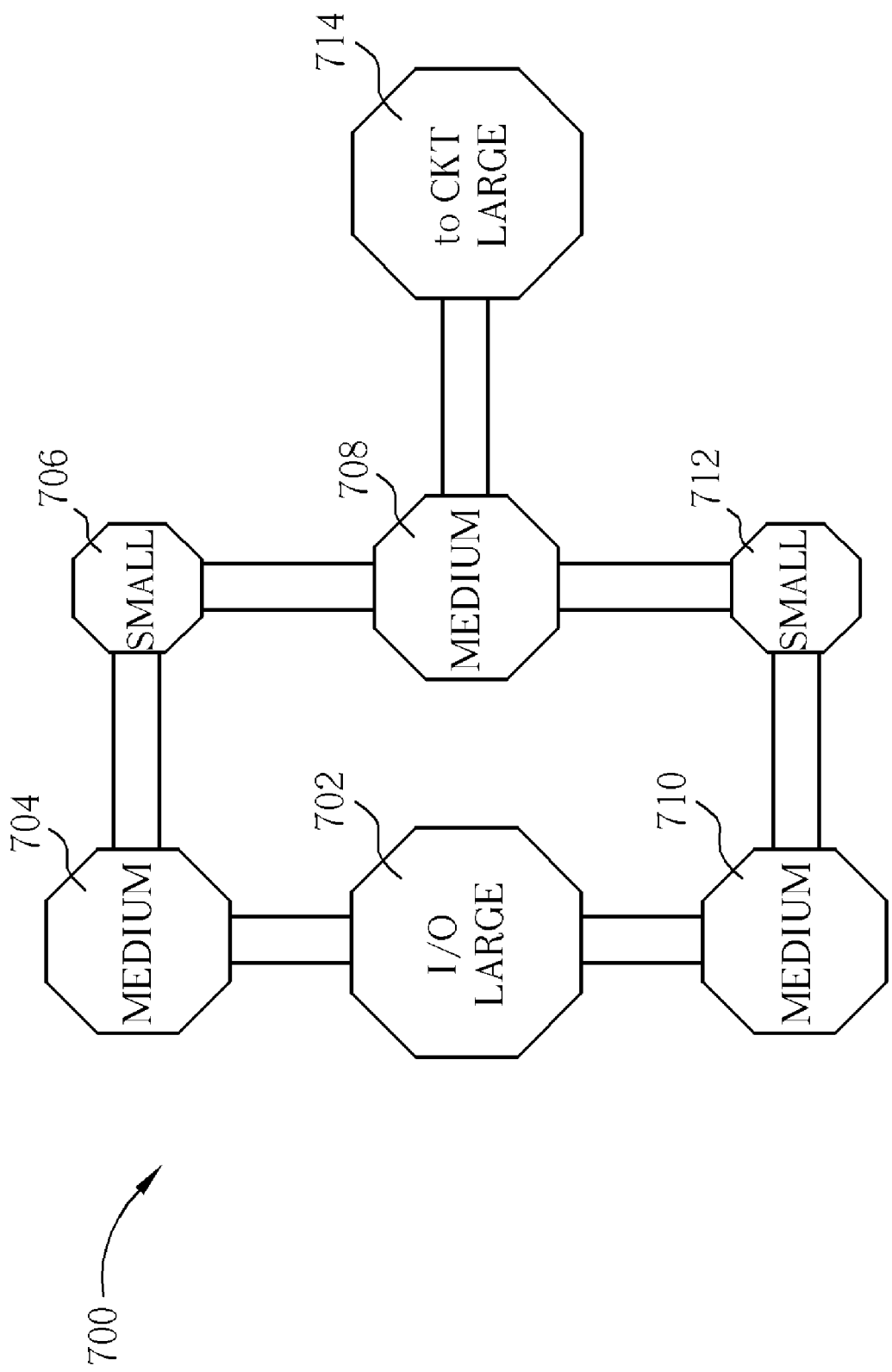
FIG. 13 is a layout diagram of a dual-route ESD protection circuit of a seventh embodiment applied to an ultra-broad band circuit according to the present invention.

Please refer to FIG. 13, which is a layout diagram of a dual-route ESD protection circuit 700 applied to an ultra-broad band radio circuit of a seventh embodiment according to the present invention. The first stage ESD protection unit 502 of the ESD protection circuit 500 shown in FIG. 11 is electrically connected to the fourth ESD protection circuit 508 through a single route consisting of the second and third ESD protection units 504 and 506. Alternatively, a first stage ESD protection unit 702 of the ESD protection circuit 700 can be electrically connected to a fifth ESD protection circuit 714 through a first route consisting of second, third and fourth ESD protection units 704, 706 and 708 or through a second route consisting second, third and the fourth ESD protection units 710, 712 and 708. The ESD protection circuit 700 having such a layout shown in FIG. 13 is recommended to be applied to a pin disposed on an edge of an integrated circuit chip.

In addition to the ESD protection units, such as the ESD protection units 602, 604, 606, 608, 702 and 714, having to have a larger area to cope with the unexpected microwave glitches and the predetermined delay of an inductor made of a transmission, the ESD protection circuit 600, and the ESD protection circuit 700 as well, can further comprise a plurality of ESD protection units having adjustable layouts according to the position that these ESD protection units are installed in an integrated circuit chip. For example, either of the ESD protection units 612 and 708 has a layout of medium area, while either of the ESD protection units 610 and 706 has a layout of small area. The capacitance values of the ESD protection units is directly related to the layout area of the ESD protection units, with ESD protection units containing larger layout areas having larger capacitance values than those with smaller layout areas.

Figure 14:
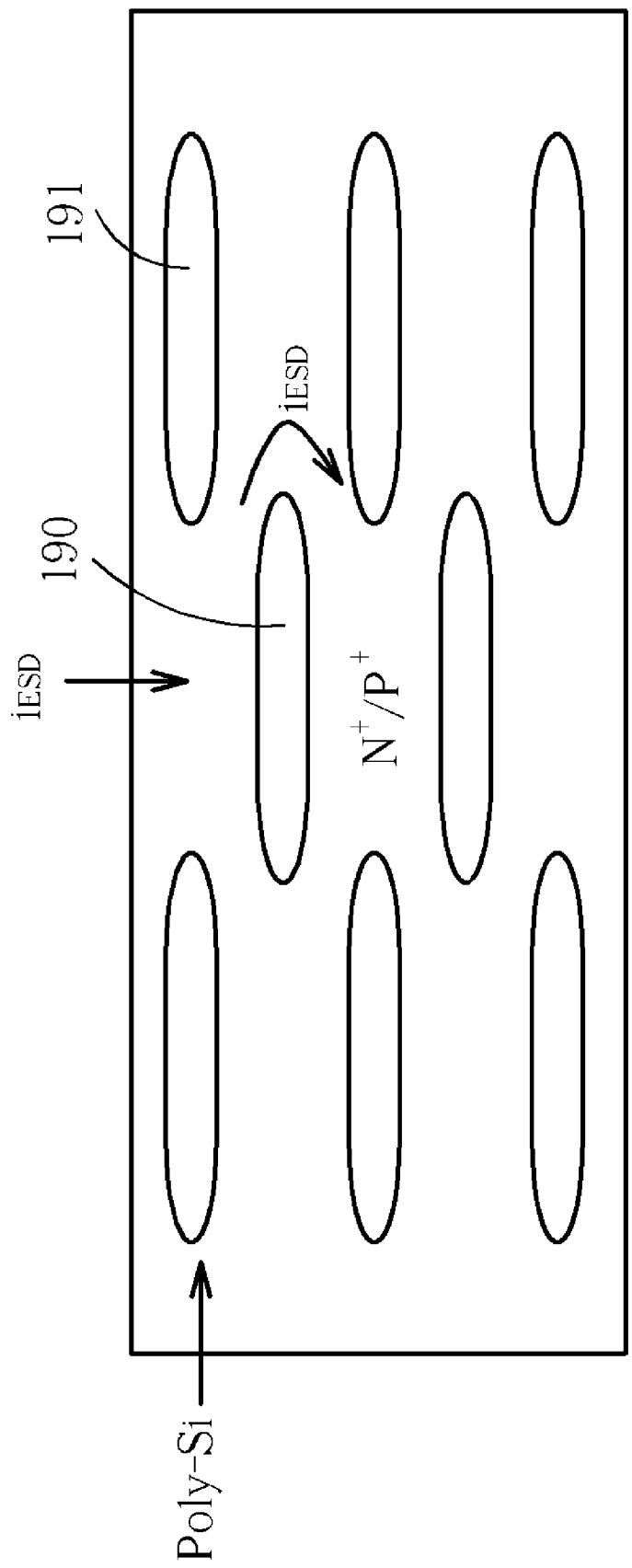
FIG. 14 and FIG. 15 are two enlarged diagrams of a first P+ region of the ESD protection circuit shown in FIG. 6 according to the present invention.
Figure 15:
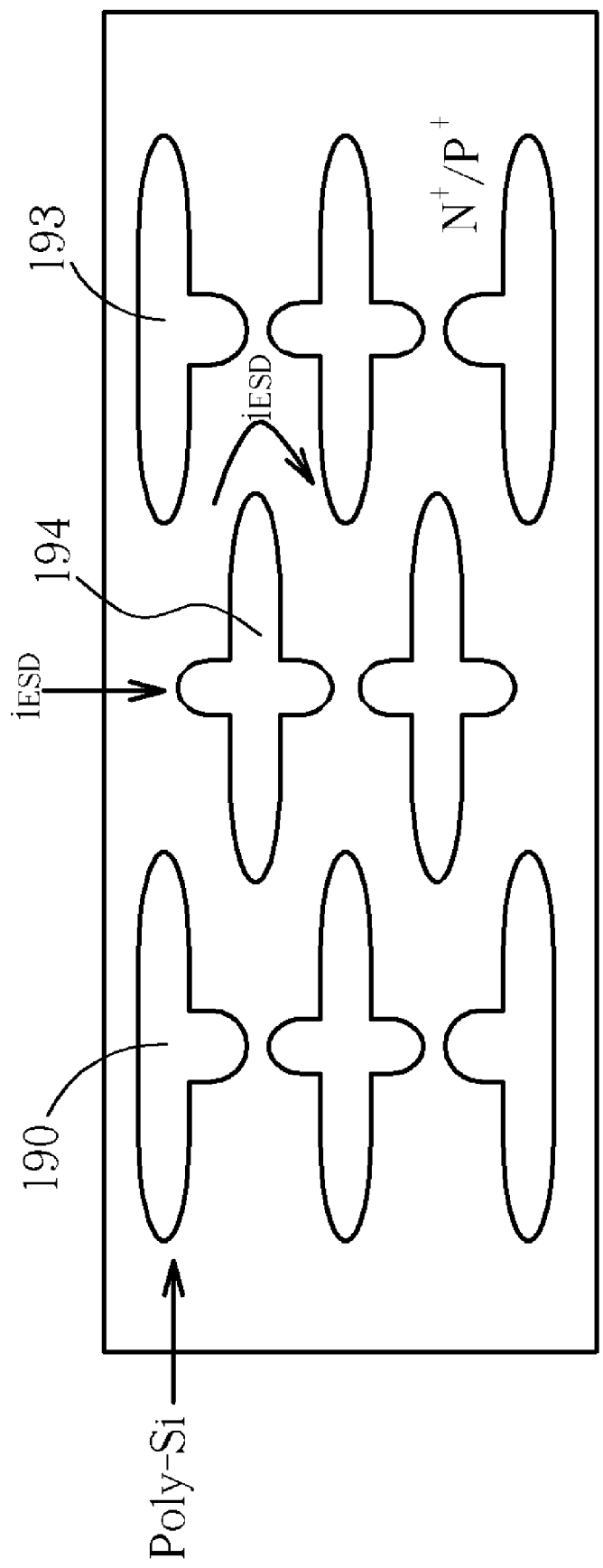

Please refer to FIG. 14 and FIG. 15, as well as to FIG. 6 and FIG. 9. FIG. 14 and FIG. 15 are two enlarged schematic diagrams of the first P⁺ region 110 of the ESD protection circuit 100 of the preferred embodiment according to the present invention. Poly-silicon 190 in the shape of a rectangle, a tee, or a cross is disposed on the first P⁺ region 110 for transforming the flat first P⁺ region 110 into a lumpy P⁺ region 110, which has a capability to uniform the current distribution in the first P⁺ region 110. Any one of the rectangle-, tee- and cross-shaped poly-silicon is symmetrical and is disposed on the first P⁺ region 110. However, the poly-silicon can be disposed on any or all regions in addition to the first P⁺ region 110, and can have an asymmetrical shape.

In general, an ESD protection circuit usually comprises a ballasting resistance having to occupy a large area to protect itself from damage induced by excessive ESD voltage. According to the preferred embodiment, the ballasting resistance has a value changed in accordance with a distance between poly-silicon 190. Moreover, the poly-silicon 190 has a capability to block and make uniform an ESD current $I_{ESD}$. Lastly, the poly-silicon 190 further has a capability to increase an area of a region where the first P-well 104 generates ions, so as to improve the ESD efficiency.

In contrast to the prior art, the present invention can provide an ESD protection circuit comprising three P-wells, one of which comprises a first P⁺ region and a first N⁺ region, another of which comprises a second P⁺ region and a second N⁺ region, and another of which comprises a third N⁺ region, a third P⁺ region and a fourth N⁺ region. The ESD protection circuit has at least the following advantages:

1. The ESD protection circuit applies the concept of a distributed amplifier adopted to meet the requirements of bandwidth matching, and to reduce the capacitances of ESD protection units of the ESD protection circuit. The ESD protection circuit is designed to have an area in accordance with an inductor's transmission delay;

2. The ESD protection circuit is pad-oriented and wafer-oriented. The ESD protection circuit is designed to have a layout and an area in accordance with the shape of a pin, the position where the pin is located on an IC chip, and the bandwidth of the IC chip;

3. The ESD protection circuit is capable of achieving all of the five ESD test modes, without an additional clamp circuit installed;

4. The triple-welled ESD protection circuit is capable of reducing leakage currents effectively;

5. The ESD protection circuit uses a $V_T$ implant technique adopted to control the doping density of the N-substrate 102 between two P-wells, and to conduct the pseudo MOS to reduce the driving voltage $V_T$ of the ESD protection circuit;

6. The ESD protection circuit comprising poly-silicon disposed on all regions has a superior ESD protection capability;

7. The poly-silicon has an effect to increase a contacting area between a region and a well where the regions is installed. The ESD protection circuit with larger contacting area is capable of generating more ions, which are good in conducting parasitic transistors;

8. The ESD protection circuit is manufactured according to a standard CMOS process, without an additional mask installed;

9. The ESD protection circuit can be installed under a pad to diminish gain degradation, so that a loss of the substrate 102 is decreased and isolation is increased; and 10. The ESD protection circuit can also be applied to an SOI manufacturing process, and can have exceptional performance if a backgate bias is controlled.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge protection circuit for a broadband circuit, the electrostatic discharge protection circuit comprising:
   a first electrostatic discharge protection unit for electrically connecting to pins of an integrated circuit chip of the broadband circuit;
   a second electrostatic discharge protection unit for electrically connecting to an inner circuit of the broadband circuit; and
   at least a third electrostatic discharge protection unit installed between the first electrostatic discharge protection unit and the second electrostatic discharge protection unit;
   wherein the first electrostatic discharge protection unit, the third electrostatic discharge protection unit and the second electrostatic discharge protection unit are electrically connected in series, and either of the first electrostatic discharge protection unit and the second electrostatic discharge protection unit has a capacitance value larger than that of the third electrostatic discharge protection unit.

2. The electrostatic discharge protection circuit of claim 1 further comprising at least a fourth electrostatic discharge protection unit installed between the first electrostatic discharge protection unit and the second electrostatic discharge protection unit, and the third electrostatic discharge protection unit and the fourth electrostatic discharge protection unit are electrically connected in series.

3. The electrostatic discharge protection circuit of claim 2, wherein either of the first electrostatic discharge protection unit and the second electrostatic discharge protection unit has a capacitance value than that of the fourth electrostatic discharge protection unit.

4. The electrostatic discharge protection circuit of claim 2 further comprising at least a fifth electrostatic discharge protection unit installed between the third electrostatic discharge protection unit and the fourth electrostatic discharge protection unit.

5. The electrostatic discharge protection circuit of claim 4, wherein either of the first electrostatic discharge protection unit and the second electrostatic discharge protection unit has a capacitance value larger than that of the fifth electrostatic discharge protection unit, and either of the third electrostatic discharge protection unit and the fourth electrostatic discharge protection unit has a capacitance value larger than that of the fifth electrostatic discharge protection unit.

6. The electrostatic discharge protection circuit of claim 4, wherein any of the first electrostatic discharge protection unit, the second electrostatic discharge protection unit, the third electrostatic discharge protection unit, the fourth electrostatic discharge protection unit and the fifth electrostatic discharge protection unit comprises a guiding structure and an equivalent capacitor.

7. The electrostatic discharge protection circuit of claim 6, wherein the guiding structure is a coplanar wave-guide, a transmission line, or an equivalent inductor.

8. An electrostatic discharge protection circuit for an ultra broadband circuit, the electrostatic discharge protection circuit comprising:
   a first electrostatic discharge protection unit for electrically connecting to pins of an integrated circuit chip of the ultra broadband circuit;

a second electrostatic discharge protection unit for electrically connecting to an inner circuit of the ultra broadband circuit;

a third electrostatic discharge protection unit electrically connected to the first electrostatic discharge protection unit and to the second electrostatic discharge protection unit; and a fourth electrostatic discharge protection unit electrically connected to the third electrostatic discharge protection unit;

wherein either of the first electrostatic discharge protection unit and the second electrostatic discharge protection unit has a capacitance value larger than that of the third electrostatic discharge protection unit, and the third electrostatic discharge protection unit has a capacitance value larger than that of the fourth electrostatic discharge protection unit.

9. The electrostatic discharge protection circuit of claim 8, wherein the electrostatic discharge protection circuit comprises a plurality of the third electrostatic discharge protection units and a plurality of the fourth electrostatic discharge protection units, the first electrostatic discharge protection unit is connected in series with one of the third electrostatic discharge protection units, one of the fourth electrostatic discharge protection units, another of the third electrostatic discharge protection units, and the second electrostatic discharge protection unit sequentially.

10. The electrostatic discharge protection circuit of claim 8, wherein the electrostatic discharge protection circuit comprises a plurality of the second electrostatic discharge protection units and a plurality of the third electrostatic discharge protection units, the first electrostatic discharge protection unit is electrically connected in series with one of the third electrostatic discharge protection units, the fourth electrostatic discharge protection unit, another of the third electrostatic discharge protection units, and one of the second electrostatic discharge protection units sequentially.

11. The electrostatic discharge protection circuit of claim 8, wherein any one in a group consisting of the first, the second, the third and the fourth electrostatic discharge protection units comprises a guiding structure and an equivalent capacitor.

12. The electrostatic discharge protection circuit of claim 11, wherein the guiding structure is a coplanar wave-guide, a transmission line, or an equivalent inductor.

* * * * *